United States Patent
Mao et al.

(10) Patent No.: US 7,208,420 B1
(45) Date of Patent: Apr. 24, 2007

(54) METHOD FOR SELECTIVELY ETCHING AN ALUMINUM CONTAINING LAYER

(75) Inventors: Zhigang Mao, San Jose, CA (US); Shenjian Liu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 105 days.

(21) Appl. No.: 10/897,880

(22) Filed: Jul. 22, 2004

(51) Int. Cl.
*H01L 21/461* (2006.01)
*H01L 21/302* (2006.01)

(52) U.S. Cl. .............. 438/710; 438/714; 438/720

(58) Field of Classification Search .............. None
See application file for complete search history.

(56) References Cited

U.S. PATENT DOCUMENTS

| | | |
|---|---|---|
| 5,126,008 A | 6/1992 | Levy |
| 5,411,631 A | 5/1995 | Hori et al. |
| 5,734,177 A | 3/1998 | Sakamoto |
| 5,783,101 A | 7/1998 | Ma et al. |
| 5,795,829 A * | 8/1998 | Shen ............ 438/694 |
| 6,080,529 A * | 6/2000 | Ye et al. ........... 430/318 |
| 6,080,681 A | 6/2000 | Tabara |
| 6,090,717 A * | 7/2000 | Powell et al. ........... 438/710 |
| 6,197,388 B1 | 3/2001 | Choi et al. |
| 6,218,309 B1 | 4/2001 | Miller et al. |
| 6,278,974 B1 | 8/2001 | Lin |
| 6,514,378 B1 | 2/2003 | Ni et al. |

OTHER PUBLICATIONS

Wolf et al., Silicon Processing for the VLSI Era, 1986, Lattice Press, vol. 1, pp. 554-555.*
Wolf, Silicon Processing for the VLSI Era, 2002, Lattice Press, vol. 4, pp. 639, 644-645, 649.*
Rossnagel et al., Handbook of Plasma Processing, 1990, Noyes Publications, p. 209.*
Wolf et al., Silicon Processing for the VLSI Era, 1986, Lattice Press, vol. 1, pp. 559 and 581.*

* cited by examiner

*Primary Examiner*—Duy-Vu N. Deo
(74) *Attorney, Agent, or Firm*—Beyer Weaver LLP

(57) ABSTRACT

A method of forming conductive connections for semiconductor devices is provided. An organic low-k dielectric layer is formed over a wafer. A conductive aluminum containing layer is formed over the organic low-k dielectric layer. The wafer is placed in an etch chamber. An etch gas comprising HBr is provided into the etch chamber. A plasma is formed from the etch gas comprising HBr. The plasma from the etch gas comprising HBr is used to selectively etch the conductive aluminum containing layer with respect to the low-k dielectric layer.

20 Claims, 4 Drawing Sheets

METHOD FOR SELECTIVELY ETCHING AN ALUMINUM CONTAINING LAYER

BACKGROUND OF THE INVENTION

The present invention relates to the fabrication of semiconductor-based devices. More particularly, the present invention relates to improved techniques for fabricating semiconductor-based devices with a metallization layer and a low-k dielectric layer.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form the desired circuit.

In an example of layer stack with a metallization layer, a dielectric layer is formed above wafer. A barrier layer may be disposed between the dielectric layer and a subsequently deposited metallization layer. A barrier layer, when provided, functions to prevent the diffusion of atoms from dielectric layer into the metallization layer.

The metallization layer typically comprises aluminum or one of the known aluminum alloys such as Al—Cu, Al—Si, or Al—Cu—Si. For convenience, the metallization layer is referred to herein as the aluminum layer or an aluminum containing layer although it should be understood that such a reference may include a layer consisting of any of the aforementioned aluminum alloys. An anti-reflective coating (ARC) layer and an overlaying photoresist (PR) layer, are then formed atop the metallization layer. The ARC layer helps prevent light (e.g., from the lithography step that patterns the photoresist) from being reflected and scattered off the surface of the metallization layer and may, in some cases, inhibit hillock growth. The photoresist layer represents a layer of conventional photoresist material, which may be patterned for etching, e.g., through exposure to ultra-violet rays. The layers of layer stack may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer are etched using a suitable photoresist technique. By way of example, one such photoresist technique involves the patterning of the photoresist layer by exposing the photoresist material in a contact or stepper lithography system, and the development of the photoresist material to form a mask to facilitate subsequent etching. Using an appropriate etchant, the areas of the metallization layer that are unprotected by the mask are then etched away, leaving behind metallization interconnect lines or features.

To achieve greater circuit density, modern IC circuits are scaled with increasingly narrower design rules. As a result, the feature sizes, i.e., the width of the interconnect lines or the spacings (e.g., trenches) between adjacent interconnect lines, have steadily decreased.

As the feature sizes shrink, it becomes increasingly difficult to achieve a good quality resist pattern with enough resist thickness due to the limits of current lithography technology. This demands processes with higher selectivity to resist to ensure transfer quality of the pattern to the layers underneath.

As the feature sizes shrink, it becomes increasingly difficult to achieve a uniform etch rate across the wafer. Typically, the etch rate in the narrow spacings is slower than that in wider trenches or open field regions. This phenomenon, referred herein as the loading in etch rates, may be a consequence of microloading and/or aspect ratio dependent etching (ARDE). Microloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates are observed among trenches that are located in areas of similar trench density and among trenches that have different aspect ratios. The loading in etch rates causes trenches to be formed in the layer stack at different rates. As a result of the etch rate variations, by the time metal etching is complete in areas having a slow etch rate (e.g., in the narrower line spacings), overetching, i.e., the inadvertent removal of materials from underlying layers, may have already occurred in areas having a higher etch rate (e.g., the open field regions).

SUMMARY OF THE INVENTION

To achieve the foregoing and other objects and in accordance with the purpose of the present invention a method of forming a conductive connections for semiconductor devices is provided. An organic low-k dielectric layer is formed over a wafer. A conductive aluminum containing layer is formed over the organic low-k dielectric layer. The wafer is placed in an etch chamber. An etch gas comprising HBr is provided into the etch chamber. A plasma is formed from the etch gas comprising HBr. The plasma from the etch gas comprising HBr is used to selectively etch the conductive aluminum containing layer with respect to the organic low-k dielectric layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
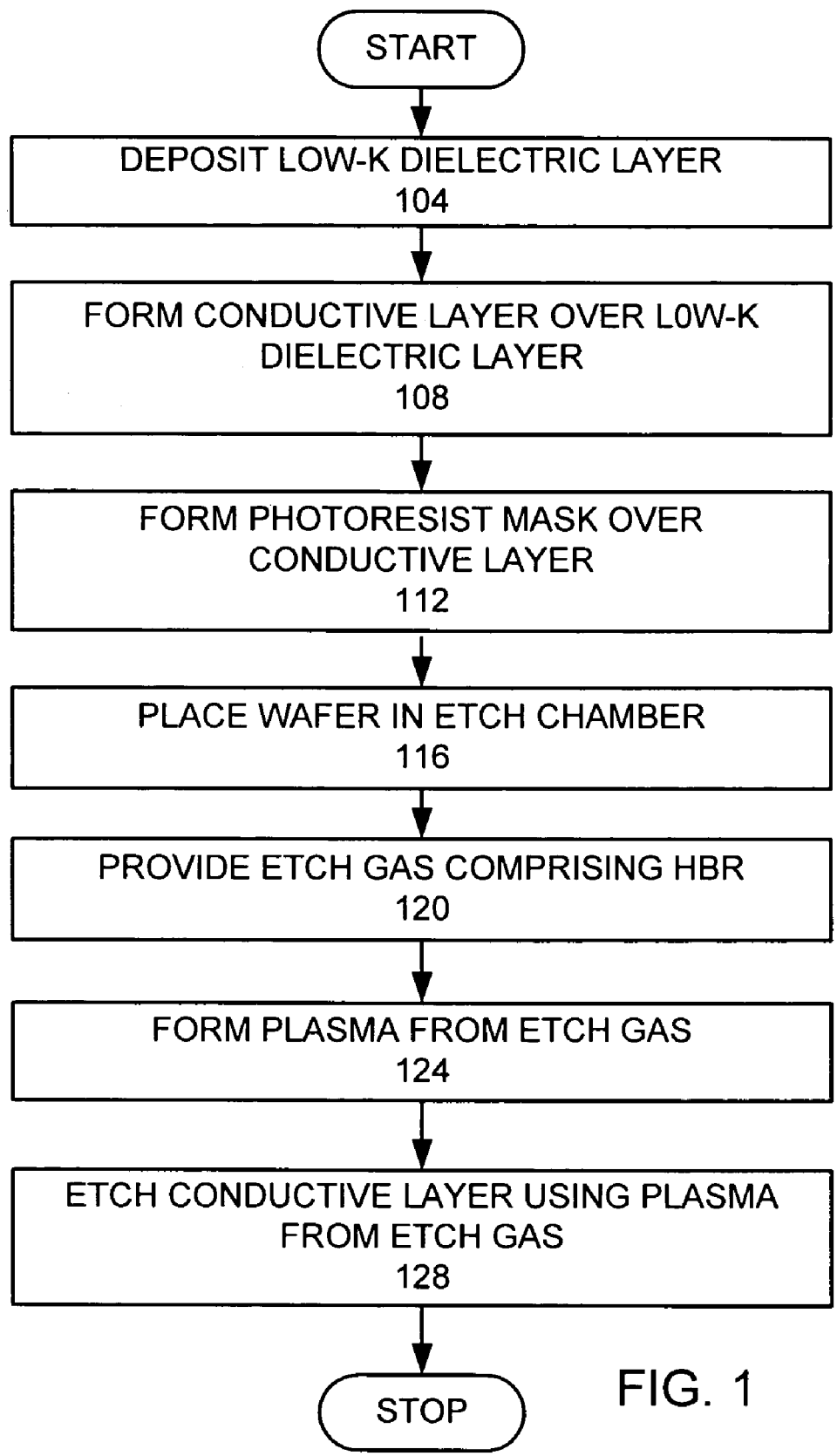
FIG. 1 is a flow chart of a process used in an embodiment of the invention.
Figure 2A:
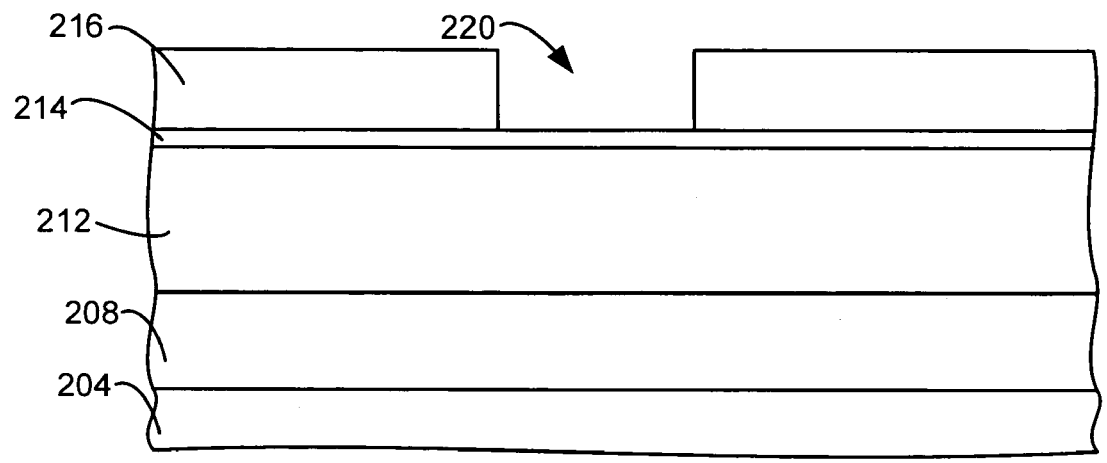
FIGS. 2A–2B are schematic side views of an etched aluminum containing conducive layer over a low-k dielectric layer according to the process of FIG. 1.

To facilitate understanding, FIG. 1 is a high level flow chart of a process used in an embodiment of the invention. A low-k dielectric layer is formed over a wafer (step 104). FIG. 2A is a cross-sectional view of a wafer 204 over which a low-k dielectric layer 208 is formed. In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. To reduce the RC delays even further, low-k dielectric constant materials have been used for interlayer dielectrics (ILDs). In the specification and claims low-k is defined as materials with an intrinsic applied k of <3.0. There are several kinds of low-k materials currently being developed and in use in the semiconductor industry, i.e. fluorinated silicon oxyfluoride (FSG), hydrogen silsesquioxane (HSQ), spin-on organic materials (Dow's SiLK™ is a non-fluorinated, highly aromatic, organic spin-on polymer with a reported k of 2.65, and inorganic systems deposited by chemical vapor deposition (CVD) such as BLACK DIAMOND™ (manufactured by APPLIED MATERIALS INC. of Santa Clara, Calif.) with reported k of 2.3–2.7.

The development of spin-on, organic, low-k materials formulated for both aluminum gap fill application and copper damascene processing has been ongoing for several years. It has demonstrated integration with SiLK in copper damascene and aluminum/tungsten schemes in a two-level structures.

A conductive layer 212 is formed over the low-k dielectric layer 208 (step 108). In this embodiment, the conductive layer 212 is of an aluminum containing material. A photoresist mask 216 is formed over the conductive layer 212. In this embodiment, an antireflective coating (ARC) 214, such as BARC, is placed over the conductive layer 212 before the photoresist mask 216 is formed, so that the ARC 214 is between the conductive layer 212 and the photoresist mask 216. Other layers may be disposed between the conductive layer 212 and the photoresist mask 216.

Figure 3:
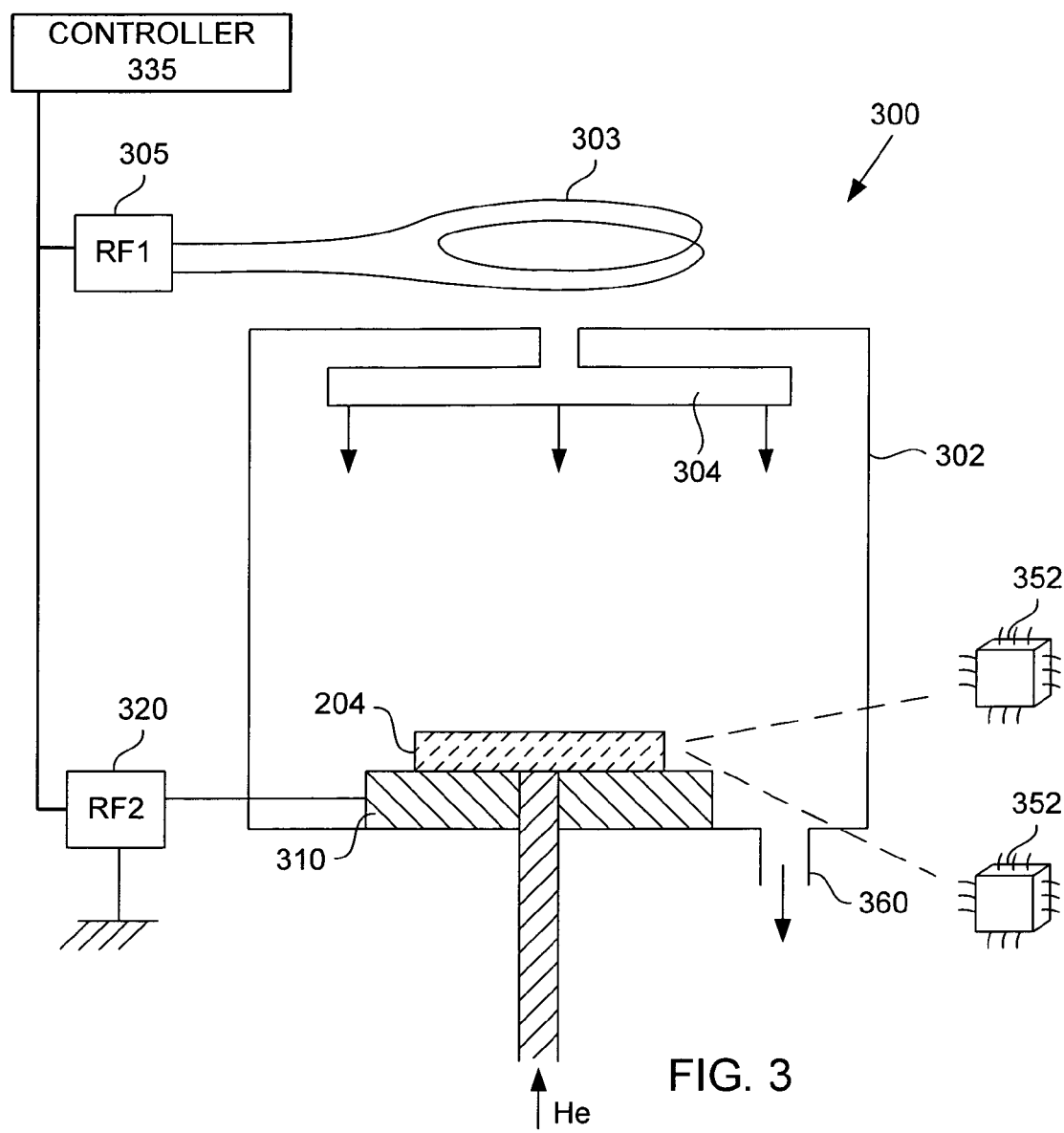
FIG. 3 is a schematic view of a process chamber that may be used in an embodiment of the invention.

The wafer 204 is placed in an etch chamber (step 116). FIG. 3 illustrates a simplified schematic of an etch chamber, such as a LAM 2300 Metal Etch System by LAM RESEARCH INC. of Fremont Calif., which is a plasma reactor, including the wafer 204 and integrated circuit chips 352, which are fabricated from dies cut from wafer 204 after the wafer is etched according to the inventive etch and processed in conventional post-etch steps. Referring to FIG. 3, a wafer reactor 300 includes a plasma processing chamber 302. Above chamber 302, there is disposed an electrode 303, which is implemented by a coil in the example of FIG. 3. Coil 303 is coupled through a window 304 (which can be made from quartz or ceramic with coated surface) energized by a RF generator 305 via a matching network (not shown in FIG. 3). The RF generators 305, 320 and gas flow may be controlled by a controller 335.

Figure 4A:
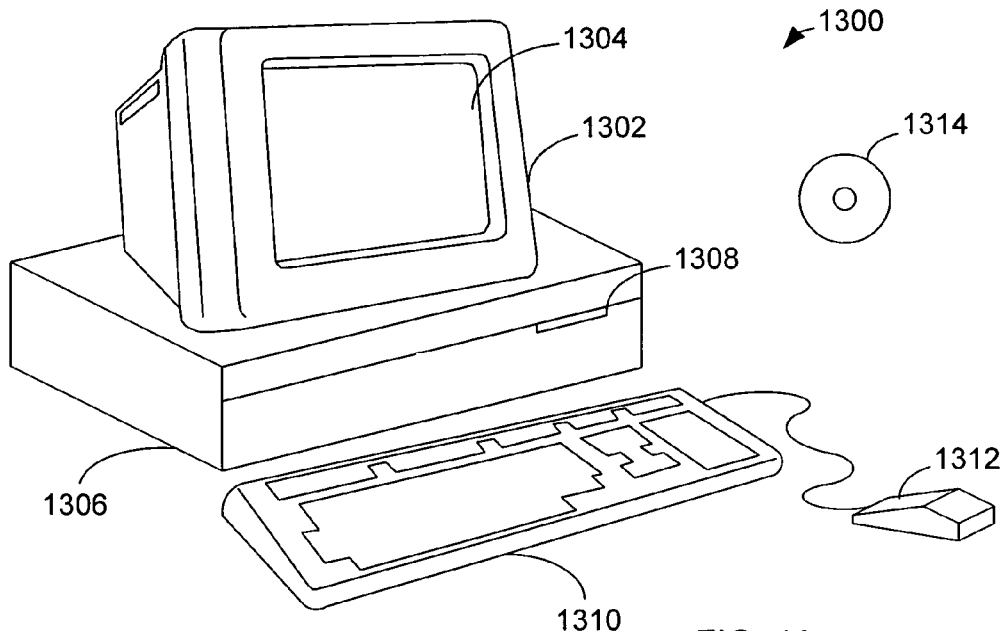
FIGS. 4A–4B are schematic views of a computer system that may be used as a controller.
Figure 4B:
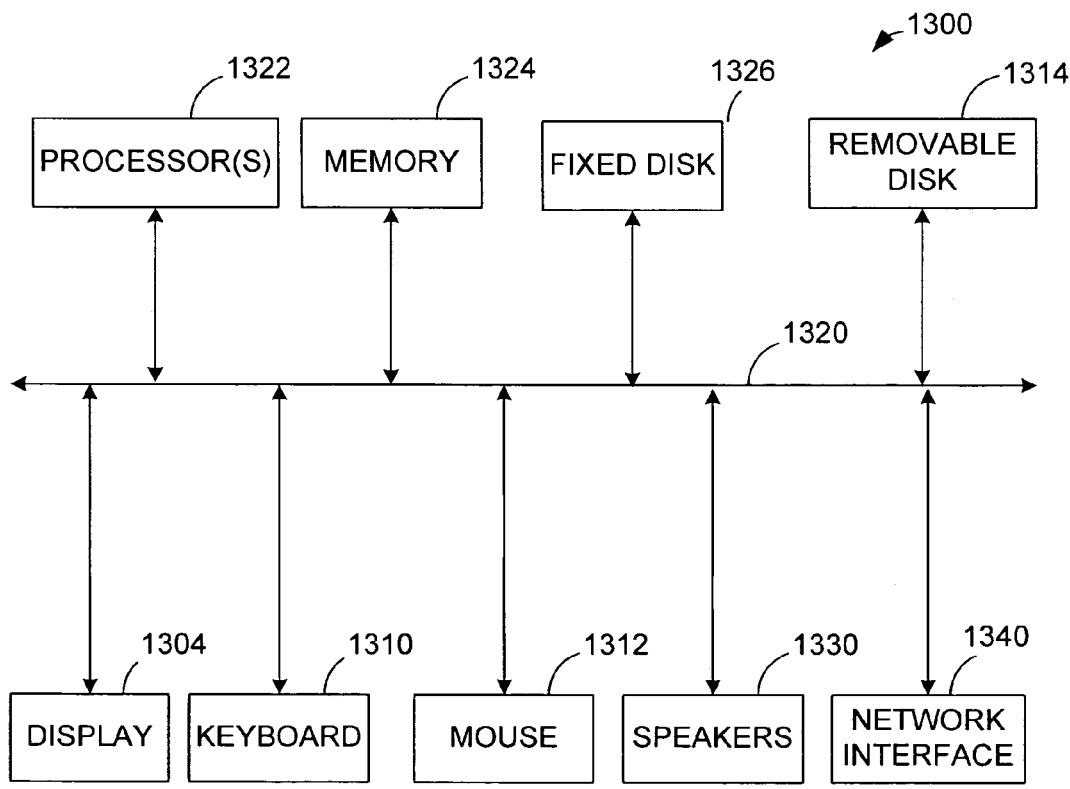

FIGS. 4A and 4B illustrate a computer system 1300, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computing system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: flash memory cards, magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
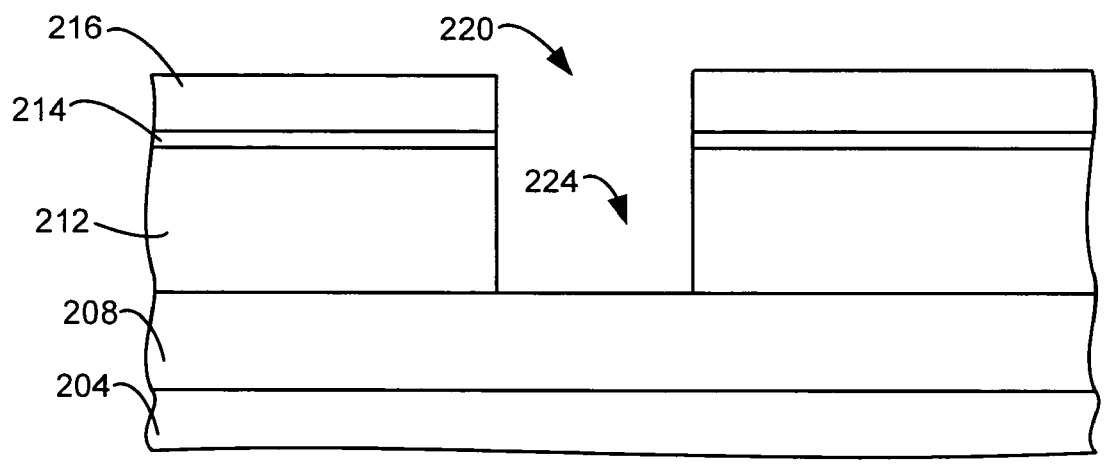

An etch gas comprising HBr is then provided into the etch chamber 300 (step 120). A plasma is formed from the etch gas comprising HBr (step 124). The conductive layer 212 is etched using the plasma from the etch gas comprising HBr (step 128), as shown in FIG. 2B to form at least one etch feature 224.

It has been found that etching an aluminum containing conductive layer over an organic low-k dielectric, such as OSG, provides a high conductive layer etch selectivity that is not less than 4:1 with respect to OSG. In addition, such an etch provides an etch selectivity of an aluminum containing conductive layer with respect to photoresist that is not less than 5:1. With a sufficiently high aluminum to organic low-k dielectric etch selectivity, the low-k dielectric material may be used assure complete etching through the conductive layer with minimal etching of the low-k dielectric layer. As a result, the invention allows the low-k dielectric to be used as an etch stop during the etch of the conductive layer, if an etch process is not uniform. High aluminum to photoresist etch selectivity allows for thinner photoresist masks to provide higher mask resolution, while still having sufficient photoresist mask to complete the aluminum etch.

EXAMPLE

In one example of the invention, the etch chamber was a LAM 2300 metal etch system. The low-k dielectric layer was an interlayer dielectric polymer. The conductive layer is pure aluminum. A 10 mTorr pressure was provided by the etch chamber. An etch gas of 100 sccm HBr and 8 sccm $N_2$ was provided. No other component gas was provided to the etch chamber for this etch in this example. A plasma with its density controlled by a 600 W TCP power and energy controlled by a 200 volts voltage bias was provided. During an etch, using this etch recipe, it was found that the aluminum conductive layer was etch at an average rate of 4453 Å/min. The photoresist had an average etch rate of 612 Å/min. The interlayer dielectric polymer had an average etch rate of 916 Å/min. Therefore, this example provided a etch with an aluminum to photoresist selectivity of about 7.3 and an aluminum to low-k dielectric selectivity of about 4.9

In another embodiment of the invention, A resist mask layer was placed on top of aluminum conductive layer, a organic-BARC layer or SiON, or TiN/Ti may deposited between the resist mask layer and aluminum conductive layer for lithography and barrier propose. In such an embodiment, the inventive etch would also selectivity etch the aluminum with respect to photoresist.

It is preferable that a pressure of 2 mTorr to 100 mTorr is maintained. It is more preferred that the chamber pressure be between 4 mTorr to 50 mTorr. It is most preferable that a chamber pressure be between 6 mTorr to 15 mTorr.

It is preferable that the bias voltage be between 20 to 800 volts. It is more preferable that the bias voltage be between 40 to 400 volts. It is most preferable that the bias voltage be between 80 to 300 volts.

It is preferable that the excitation power be between 300 to 1500 Watts. It is more preferable that the excitation power be between 400 to 1000 Watts. It is most preferable that the excitation power be between 500 to 800 Watts.

It is preferred that the aluminum containing layer comprises at least 75% Al, by atoms. It is more preferred that the aluminum containing layer comprises at least 90% Al. It is most preferred that the aluminum containing layer consists essentially of aluminum. Some of the alloys that may be added to the aluminum containing layer are copper and silicon. If an aluminum alloy is used, it is preferred that the alloy consist essentially of aluminum and copper.

It is preferred that the etch gas comprises at least 20% HBr. It is more preferable that the etch gas comprises at least 80% HBr. It is most preferable that the etch gas comprises at least 90% HBr. It is preferred that the etch gas further comprises $N_2$. It is preferable that the etch gas consists essentially of HBr and $N_2$. In other embodiments, the etch gas consists essentially of HBr.

If aluminum oxide is present in the conductive layer, some embodiments would also add $BCl_3$ to the etch gas. In such an embodiment, it is preferred that the etch gas consists essentially of HBr, $BCl_3$, and $N_2$. In addition, inert gases, such as argon may be added to the etch gas. In such an embodiment, it is preferred that the etch gas consists essentially of Ar, HBr, $BCl_3$, and $N_2$.

In other embodiments, the etch gas is free of chlorine containing components, such as chlorine and $BCl_3$. In addition, it is preferred that the etch gas is free of any fluorine containing gas when etching a blanket Al wafer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method of forming a conductive connections for semiconductor devices, comprising:
   forming an organic low-k dielectric layer over a wafer;
   forming an electrically conductive aluminum containing layer over the organic low-k dielectric layer;
   placing the wafer in an etch chamber;
   providing an etch gas comprising HBr into the etch chamber, wherein the HBr has a flow rate, wherein the flow rate of the HBr is at least 80% of a total flow rate of the etch gas;
   forming a plasma from the etch gas comprising HBr; and
   using the plasma from the etch gas comprising HBr to selectively etch the electrically conductive aluminum containing layer with respect to the organic low-k dielectric layer to form electrically conductive connections from the electrically conductive aluminum containing layer.

2. The method, as recited in claim 1, wherein the etch gas further comprises $N_2$.

3. The method, as recited in claim 2, further comprising forming a photoresist mask over the conductive aluminum containing layer before placing the wafer in the etch chamber, wherein the using the plasma from the etch gas selectively etches the conductive aluminum containing layer with respect to the photoresist.

4. The method, as recited in claim 3, wherein the conductive layer is pure aluminum.

5. The method, as recited in claim 3, wherein the conductive layer consists essentially of aluminum and copper.

6. The method, as recited in claim 3, wherein the etch gas is free of any fluorine containing gas.

7. The method, as recited in claim 3, further comprising providing a bias voltage of between 20 to 800 volts.

8. The method, as recited in claim 3, further comprising using the organic low-k dielectric layer as an etch stop.

9. The method, as recited in claim 3, wherein the etch gas consists essentially of HBr and $N_2$.

10. The method, as recited in claim 3, wherein the etch gas consists essentially of $BCl_3$, HBr, and $N_2$.

11. The method, as recited in claim 3, wherein the etch gas consists essentially of Ar, HBr, $N_2$, and $BCl_3$.

12. The method, as recited in claim 3, wherein the etch gas is free of any chlorine containing gas.

13. The method, as recited in claim 1, wherein the etch gas consists essentially of $BCl_3$, HBr, and $N_2$.

14. The method, as recited in claim 1, wherein the etch gas consists essentially of Ar, HBr, $N_2$, and $BCl_3$.

15. The method, as recited in claim 1, further comprising forming a photoresist mask over the conductive aluminum containing layer before placing the wafer in the etch chamber, wherein the using the plasma from the etch gas selectively etches the conductive aluminum containing layer with respect to the photoresist.

16. The method, as recited in claim 1, wherein the conductive layer is pure aluminum.

17. The method, as recited in claim 1, wherein the conductive layer consists essentially of aluminum and copper.

18. The method, as recited in claim 1, further comprising providing a bias voltage of between 20 to 800 volts.

19. A method of forming a conductive connections for semiconductor devices, comprising:
  forming an organic low-k dielectric layer over a wafer;
  forming an electrically conductive aluminum containing layer over the organic low-k dielectric layer;
  placing the wafer in an etch chamber;
  providing an etch gas comprising HBr into the etch chamber, wherein the etch gas consists essentially of HBr and $N_2$;
  forming a plasma from the etch gas comprising HBr; and
  using the plasma from the etch gas comprising HBr to selectively etch the electrically conductive aluminum containing layer with respect to the organic low-k dielectric layer to form electrically conductive connections from the electrically conductive aluminum containing layer.

20. A method of forming a conductive connections for semiconductor devices, comprising:
  forming an organic low-k dielectric layer over a wafer;
  forming an electrically conductive aluminum containing layer over the organic low-k dielectric layer;
  placing the wafer in an etch chamber;
  providing an etch gas comprising HBr into the etch chamber, wherein the etch gas is free of any chlorine containing gas;
  forming a plasma from the etch gas comprising HBr; and
  using the plasma from the etch gas comprising HBr to selectively etch the electrically conductive aluminum containing layer with respect to the organic low-k dielectric layer to form electrically conductive connections from the electrically conductive aluminum containing layer.

* * * * *